(12) United States Patent
Chen et al.

(10) Patent No.: US 10,454,479 B2
(45) Date of Patent: Oct. 22, 2019

(54) INVERTER WITH BALANCED VOLTAGES ACROSS INTERNAL TRANSISTORS

(71) Applicant: RichWave Technology Corp., Taipei (TW)

(72) Inventors: Chih-Sheng Chen, Taipei (TW); Tien-Yun Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/111,238

(22) Filed: Aug. 24, 2018

(65) Prior Publication Data
US 2019/0123747 A1    Apr. 25, 2019

(30) Foreign Application Priority Data

Oct. 20, 2017   (TW) .............................. 106136053 A (51) Int. Cl.
*H03K 19/003* (2006.01)
*H03K 19/00* (2006.01)
(Continued)

(52) U.S. Cl.
CPC ..... *H03K 19/00315* (2013.01); *H03K 19/003* (2013.01); *H03K 19/0013* (2013.01);
(Continued)

(58) Field of Classification Search
CPC ............. H03K 19/0016; H03K 17/102; H03K 17/693; H03K 19/018521; H03K 19/0013; H03K 19/00315; H03K 19/00361; H03K 19/01707; H03K 17/063; H03K 17/6872; H03K 19/00384; H03K 17/0822; H03K 17/687; H03K 19/017; H03K 19/0948;
(Continued)

(56) References Cited

U.S. PATENT DOCUMENTS

| 4,103,188 A | 7/1978 | Morton |
| 5,198,699 A * | 3/1993 | Hashimoto ........... H03K 17/163 326/121 |

(Continued)

FOREIGN PATENT DOCUMENTS

| EP | 1 488 516 B1 | 10/2010 |
| TW | 307953 | 6/1997 |

(Continued)

*Primary Examiner* — Vibol Tan
(74) *Attorney, Agent, or Firm* — Winston Hsu (57) ABSTRACT

An inverter includes a first system voltage terminal, a second system voltage terminal, an output terminal, a plurality of P-type transistors, a plurality of N-type transistors, and a voltage drop impedance element. The first system voltage terminal receives a first voltage, and the second system voltage terminal receives a second voltage. The plurality of P-type transistors are coupled in series between the first system voltage terminal and the output terminal. The plurality of N-type transistors are coupled in series between the output terminal and the second system voltage terminal. The voltage drop impedance element is coupled in parallel with a first N-type transistor of the plurality of N-type transistors, and the impedance of the voltage drop impedance element is smaller than the impedance of the first N-type transistor when the first N-type transistor is turned off.

16 Claims, 9 Drawing Sheets

(51) Int. Cl.
*H03K 19/017* (2006.01)
*H03K 19/20* (2006.01)

(52) U.S. Cl.
CPC ....... *H03K 19/0016* (2013.01); *H03K 19/017* (2013.01); *H03K 19/01707* (2013.01); *H03K 19/20* (2013.01)

(58) Field of Classification Search
CPC ............... H03K 19/0963; H03K 19/20; H03K 2217/0036; H03K 3/356113; H03K 5/1506; H03K 17/04123; H03K 17/08122; H03K 17/08142; H03K 17/164; H03K 17/284; H03K 19/215; H03K 2005/00039; H03K 2017/066; H03K 2217/0054

See application file for complete search history.

(56) References Cited

U.S. PATENT DOCUMENTS

| | | | |
|---|---|---|---|
| 5,304,874 A | 4/1994 | Vinal | |
| 5,568,081 A * | 10/1996 | Lui | H03K 17/166 326/27 |
| 5,767,728 A | 6/1998 | Michail | |
| 6,124,741 A * | 9/2000 | Arcus | H03L 7/0895 326/83 |
| 6,127,898 A * | 10/2000 | Naura | H03K 3/0231 326/31 |
| 6,144,217 A * | 11/2000 | Iwata | H03K 19/00361 326/26 |
| 6,307,396 B1 * | 10/2001 | Mulatti | H03K 19/0016 326/58 |
| 6,411,149 B1 * | 6/2002 | Ooishi | H03K 5/133 327/262 |
| 6,492,847 B1 | 12/2002 | Goetz | |
| 6,580,306 B2 * | 6/2003 | Hardee | H03K 19/00315 327/112 |
| 6,744,294 B1 * | 6/2004 | Svensson | H03F 1/223 326/83 |
| 6,844,769 B2 * | 1/2005 | Yamamoto | H03K 17/063 326/81 |
| 7,495,483 B2 * | 2/2009 | Kumar | H03K 19/00384 326/62 |
| 7,692,473 B2 * | 4/2010 | Ono | H01L 27/0255 327/303 |
| 7,880,470 B2 * | 2/2011 | Amanuma | H03K 17/0412 324/415 |
| 8,421,501 B1 * | 4/2013 | Rien | H03K 19/018521 326/68 |
| 8,610,470 B2 * | 12/2013 | Iriguchi | H03K 19/00315 327/112 |
| 8,860,497 B1 * | 10/2014 | Pattnayak | H03K 17/0822 327/108 |
| 9,166,585 B2 * | 10/2015 | Roy | H03K 19/0013 |
| 9,252,651 B2 * | 2/2016 | Mott | H02M 1/088 |
| 2016/0065214 A1 | 3/2016 | Takeda | |
| 2017/0133923 A1 | 5/2017 | Freeman | |
| 2017/0153659 A1 * | 6/2017 | Quelen | G05F 3/242 |

FOREIGN PATENT DOCUMENTS

| | | |
|---|---|---|
| TW | 201347145 A | 11/2013 |
| TW | I561008 B | 12/2016 |
| WO | WO98/38739 A1 | 9/1998 |

* cited by examiner

INVERTER WITH BALANCED VOLTAGES ACROSS INTERNAL TRANSISTORS

CROSS REFERENCE TO RELATED APPLICATION

This application claims priority of Taiwan application No. 106136053, which was filed on Oct. 20, 2017, and is included herein by reference.

TECHNICAL FIELD

This invention is related to an inverter, and more particularly, is related to an inverter with balanced voltages across internal transistors.

BACKGROUND

The inverter is a logic gate to implement logic NOT in digital logic circuits. That is, the inverter can output a high voltage signal while receiving a low voltage signal, and can output a low voltage signal while receiving a high voltage signal. Generally, the inverter can be implemented by an N-type transistor and a P-type transistor coupled in series. However, due to the characteristic of high input impedance and low output impedance, the inverters are also used as signal buffers or delay elements for output signals, and can be applied to many kinds of circuits.

In prior art, when the inverter is operated with high voltages, the inverter may include more series-connected transistors to increase the overall voltage handling ability. However, in practical operations, since the cross voltages applied on the transistors may be different, some of the transistors may have to endure high cross voltages for a long time, which may cause damages to the transistors and lower the system stability.

SUMMARY

One embodiment of the present invention discloses an inverter. The inverter includes a first system voltage terminal, a second system voltage terminal, an output terminal, a plurality of P-type transistors, a plurality of N-type transistors, and a first voltage drop impedance element.

The first system voltage terminal receives a first voltage, and the second system voltage terminal receives a second voltage. The plurality of P-type transistors are coupled in series between the first system voltage terminal and the output terminal. The plurality of N-type transistors are coupled in series between the output terminal and the second system voltage terminal. The first voltage drop impedance element is coupled in parallel with a first N-type transistor of the plurality of N-type transistors. The impedance of the first voltage drop impedance element is smaller than the impedance of the first N-type transistor when the first N-type transistor is turned off.

Another embodiment of the present invention discloses an inverter. The inverter includes a first system voltage terminal, a second system voltage terminal, an output terminal, a plurality of P-type transistors, and a plurality of N-type transistors. The first system voltage terminal receives a first voltage, and the second system voltage terminal receives a second voltage. The plurality of P-type transistors are coupled in series between the first system voltage terminal and the output terminal. The plurality of N-type transistors are coupled in series between the output terminal and the second system voltage terminal. The channel width-to-length ratio of a first N-type transistor of the plurality of N-type transistors is greater than the channel width-to-length ratio of a second N-type transistor of the plurality of N-type transistors.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
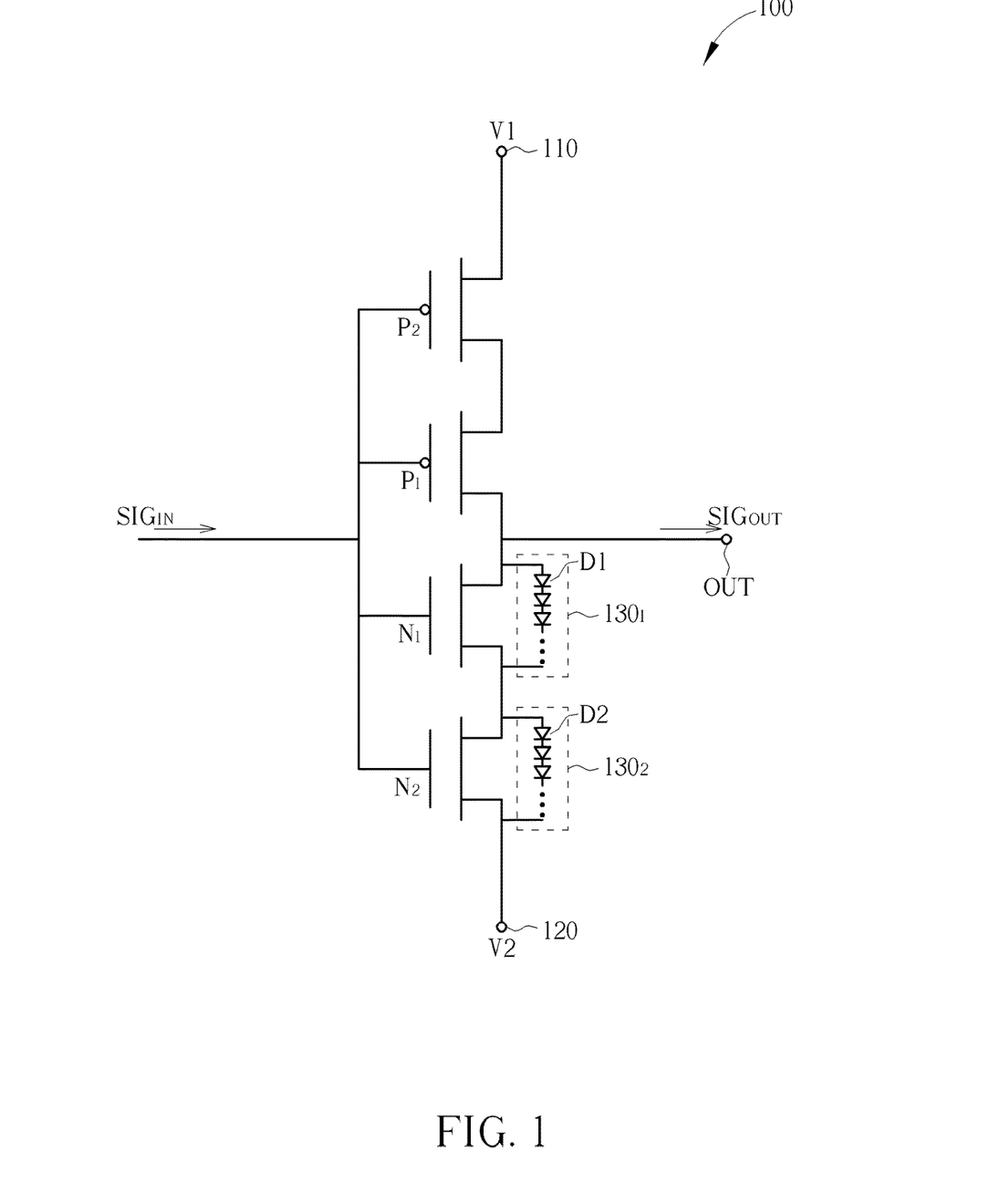
FIG. 1 shows an inverter according to one embodiment of the present invention.

FIG. 1 shows an inverter 100 according to one embodiment of the present invention. The inverter 100 includes a first system voltage terminal 110, a second system voltage terminal 120, an output terminal OUT, P-type transistors $P_1$ and $P_2$, N-type transistors $N_1$ and $N_2$, and voltage drop impedance elements $130_1$ and $130_2$.

The P-type transistors $P_1$ and $P_2$ can be coupled in series between the first system voltage terminal 110 and the output terminal OUT, and the N-type transistors $N_1$ and $N_2$ can be coupled in series between the output terminal OUT and the second system voltage terminal 120. The first system voltage terminal 110 can receive a first voltage V1, and the second system voltage terminal 120 can receive a second voltage V2. In some embodiments, the first voltage V1 can be higher than the second voltage V2. For example, the first voltage V1 can be used to provide the high voltage of the inverter 100, and can be, for example, 2.5V, while the second voltage V2 can be used to provide the low voltage of the inverter 100, and can be, for example, −2.5V. In other embodiments, the first voltage V1 can be the high voltage of the system, and the second voltage V2 can be the ground voltage of the system.

The P-type transistor $P_1$ has a first terminal, a second terminal, and a control terminal. The second terminal of the P-type transistor $P_1$ is coupled to the output terminal OUT. The P-type transistor $P_2$ has a first terminal, a second terminal, and a control terminal. The first terminal of the P-type transistor $P_2$ is coupled to the first system voltage terminal 110, and the second terminal of the P-type transistor $P_2$ is coupled to the first terminal of the P-type transistor $P_1$. The N-type transistor $N_1$ has a first terminal, a second terminal, and a control terminal. The first terminal of the N-type transistor $N_1$ is coupled to the output terminal OUT. The N-type transistor $N_2$ has a first terminal, a second terminal, and a control terminal. The first terminal of the N-type transistor $N_2$ is coupled to the second terminal of the N-type transistor $N_1$ and the second terminal of the N-type transistor $N_2$ is coupled to the second system voltage terminal 120.

In some embodiments, the control terminals of the P-type transistors $P_1$ and $P_2$ and the control terminals of the N-type transistors $N_1$ and $N_2$ can be coupled together for receiving the same control signal $SIG_{IN}$. When the control signal $SIG_{IN}$ is at a high voltage, e.g. the first voltage V1, the P-type transistors $P_1$ and $P_2$ will be turned off and the N-type transistors $N_1$ and $N_2$ will be turned on, pulling down the output signal $SIG_{OUT}$ outputted from the output terminal OUT to be close to the second voltage V2.

In contrary, when the control signal $SIG_{IN}$ is at a low voltage, e.g. the second voltage V2, the P-type transistors $P_1$ and $P_2$ will be turned on and the N-type transistors $N_1$ and $N_2$ will be turned off, pulling up the output signal $SIG_{OUT}$ outputted from the output terminal OUT to be close to the first voltage V1. In this case, the N-type transistors $N_1$ and $N_2$ are turned off, and the total cross voltage applied on the N-type transistors $N_1$ and $N_2$ would be almost equal to the voltage difference between the first voltage V1 and the second voltage V2. That is, the N-type transistors $N_1$ and $N_2$ together would have to endure the voltage difference between the first voltage V1 and the second voltage V2.

Since the N-type transistor $N_1$ is closer to the output terminal OUT and the N-type transistor $N_2$ is closer to the second system voltage terminal 120, the gate-to-source voltages of these two transistors are different. Therefore, when turned off, the impedance of the N-type transistors $N_1$ and $N_2$ would be quite different, resulting in unequal drain-to-source voltages of these two transistors. That is, the cross voltages applied on the N-type transistors $N_1$ and $N_2$ are not balanced. For example, if the first voltage V1 is 2.5V and the second voltage V2 is −2.5V, then the N-type transistors $N_1$ and $N_2$ would have to endure a total of 5V together. However, the cross voltage applied on the N-type transistor $N_1$ may be more than 3V while the cross voltage applied on the N-type transistor $N_2$ may be less than 2V. In the case with the drain-to-source voltages being largely unbalanced, the turned-off N-type transistor $N_1$ may break down, resulting in abnormal operations of the inverter 100 and causing instability of the system.

However, in FIG. 1, the voltage drop impedance element $130_1$ is coupled in parallel with the N-type transistor $N_1$, and the impedance of the voltage drop impedance element $130_1$ is smaller than the impedance of the N-type transistor $N_1$ when the N-type transistor $N_1$ is turned off. Also, the voltage drop impedance element $130_2$ is coupled in parallel with the N-type transistor $N_2$, and the impedance of the voltage drop impedance element $130_2$ is smaller than the impedance of the N-type transistor $N_2$ when the N-type transistor $N_2$ is turned off. In other words, when the N-type transistors $N_1$ and $N_2$ are turned off, the voltage drop impedance elements $130_1$ and $130_2$ can form a current path between the output terminal OUT and the second system voltage terminal 120. Since the impedances of the voltage drop impedance elements $130_1$ and $130_2$ are smaller than the impedances of the N-type transistors $N_1$ and $N_2$ when the N-type transistors $N_1$ and $N_2$ are turned off, the current flowing through the voltage drop impedance elements $130_1$ and $130_2$ will be greater than the leakage current flowing through the N-type transistors $N_1$ and $N_2$ when the N-type transistors $N_1$ and $N_2$ are turned off. In this case, by selecting the voltage drop impedance elements $130_1$ and $130_2$ to have proper impedances, the cross voltages applied on the N-type transistors $N_1$ and $N_2$ can be balanced. Also, in some embodiments, the impedance of the voltage drop impedance elements $130_1$ and $130_2$ should be greater than 0.

For example, if the effective impedance of the voltage drop impedance element $130_1$ in parallel with the N-type transistor $N_1$ being turned off is substantially equal to the effective impedance of the voltage drop impedance element $130_2$ in parallel with the N-type transistor $N_2$ being turned off, then the voltage between the output terminal OUT and the second system voltage terminal 120 will be endured by the voltage drop impedance element $130_1$ coupled in parallel with the N-type transistor $N_1$ and the voltage drop impedance element $130_2$ coupled in parallel with the N-type transistor $N_2$ equally. In other words, the N-type transistor $N_1$ and $N_2$ would have the same cross voltages. Consequently, the issue of system instability caused by unbalanced cross voltages on the N-type transistors $N_1$ and $N_2$ can be mitigated. In some embodiments, since the inverter 100 is operated with direct current (DC) power, the effective impedance can be referred to as effective resistance.

In addition, if the impedance of the voltage drop impedance element $130_1$ is much smaller than the impedance of the N-type transistor $N_1$ when the N-type transistor $N_1$ is turned off, for example, ten times smaller, then the current flowing through the voltage drop impedance element $130_1$ would be ten times greater than the current flowing through the N-type transistor $N_1$. Therefore, the cross voltage applied on the N-type transistor $N_1$ would be dominated by the voltage drop impedance element $130_1$. Similarly, if the impedance of the voltage drop impedance element $130_2$ is much smaller than the impedance of the N-type transistor $N_2$ when the N-type transistor $N_2$ is turned off, for example, ten times smaller, then the current flowing through the voltage drop impedance element $130_2$ would be ten times greater than the current flowing through the N-type transistor $N_2$. Therefore, the cross voltage applied on the N-type transistor $N_2$ would be dominated by the voltage drop impedance element $130_2$. In this case, if the voltage drop impedance elements $130_1$ and $130_2$ have similar impedances, that is, if the impedances of the voltage drop impedance elements $130_1$ and $130_2$ are substantially the same, then the N-type transistors $N_1$ and $N_2$ will have similar cross voltages, mitigating the system instability caused by high cross voltages applied on only some of the transistors.

In FIG. 1, the voltage drop impedance element $130_1$ can include X diodes D1 coupled in series, and the voltage drop impedance element $130_2$ can include Y diodes D2 coupled in series. The diodes D1 are independent from the N-type transistor $N_1$, and the diodes D2 are independent from the N-type transistor $N_2$. Suppose the N-type transistors $N_1$ and $N_2$ have the same electronic characteristics, X and Y can be the same integer greater than 1. Consequently, the effective impedance of the voltage drop impedance element $130_1$ in parallel with the N-type transistor $N_1$ being turned off would be equal to the effective impedance of the voltage drop impedance element $130_2$ in parallel with the N-type transistor $N_2$ being turned off, ensuring the cross voltages applied on the N-type transistors $N_1$ and $N_2$ to be the same. In some other situations, if the electronic characteristics of the N-type transistor $N_1$ and $N_2$ are different, then X and Y may be chosen to be different values so the cross voltages applied on the N-type transistor $N_1$ and $N_2$ can still be substantially the same.

To prevent the inverter 100 from generating too much leakage currents, each of the diodes D1 and D2 can be in a state close to being turned on but not being turned on completely when the output terminal OUT outputs the high voltage. In addition, each of the diodes D1 and D2 has an anode and a cathode, and for each of the diodes D1 and D2, the voltage at the anode would be higher than the voltage at the cathode. That is, when the output terminal OUT outputs the high voltage, each of the diodes D1 and D2 can be forward biased and can be in the state close to being turned on but not fully turned on. However, this is not to limit the scope of the present invention.

Figure 2:
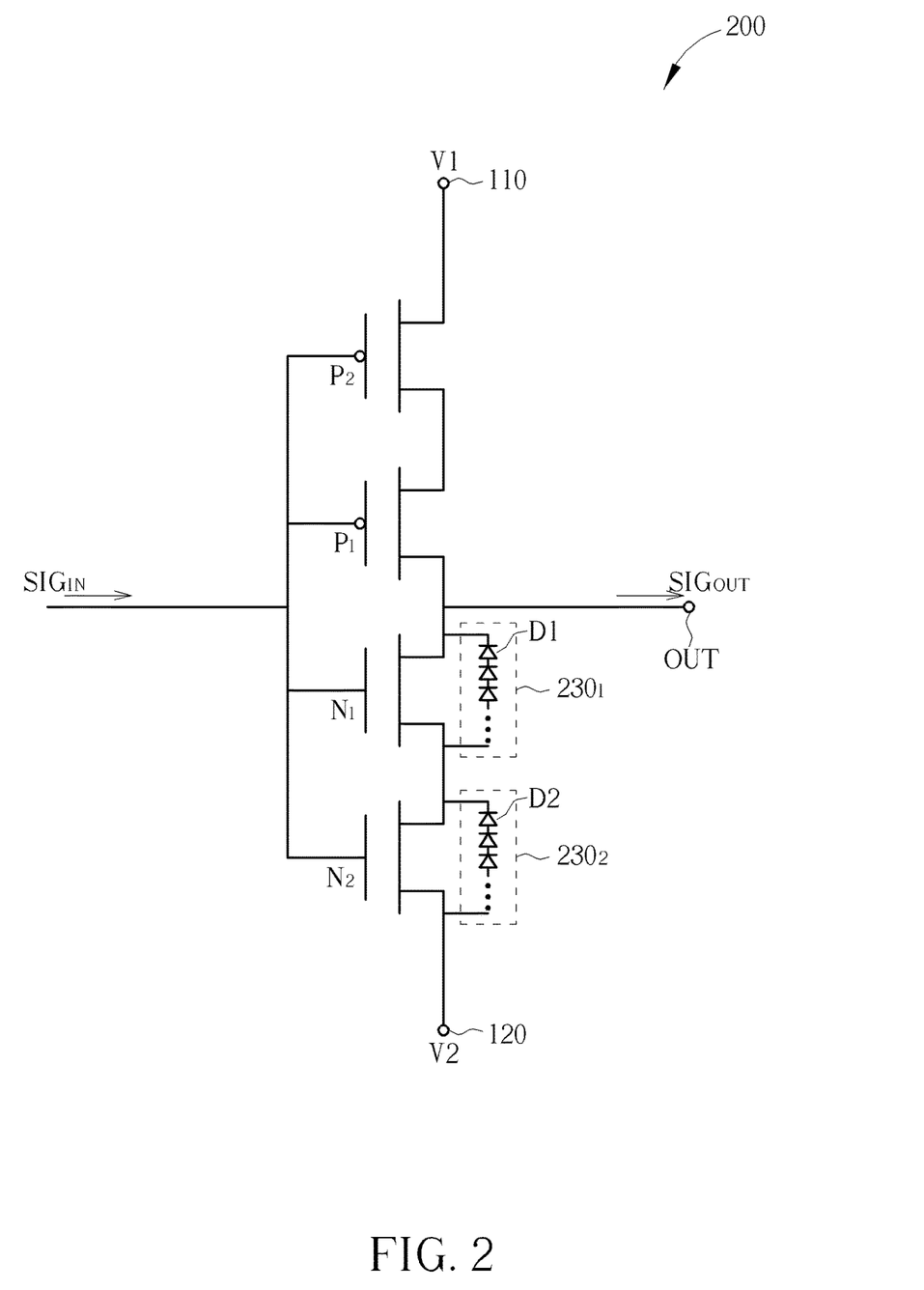
FIG. 2 shows an inverter according to another embodiment of the present invention.

FIG. 2 shows an inverter 200 according to one embodiment of the present invention. The inverters 100 and 200 have similar structures and can be operated with similar principles. However, the main difference between these two inverters is in that the voltage of the anode is lower than the voltage at the cathode for each of the diodes D1 in the voltage drop impedance element $230_1$, and the voltage of the anode is lower than the voltage at the cathode for each of the diodes D2 in the voltage drop impedance element $230_2$. In other words, when the output terminal OUT outputs the high voltage, each of the diodes D1 and D2 is reverse biased, and is in the state close to being turned on but not fully turned on. Since the reverse biased diodes may provide even greater impedance than the forward biased diodes, the number of diodes required by the voltage drop impedance elements $230_1$ and $230_2$ can be smaller than the number of diodes required by the voltage drop impedance elements $130_1$ and $130_2$.

Figure 3:
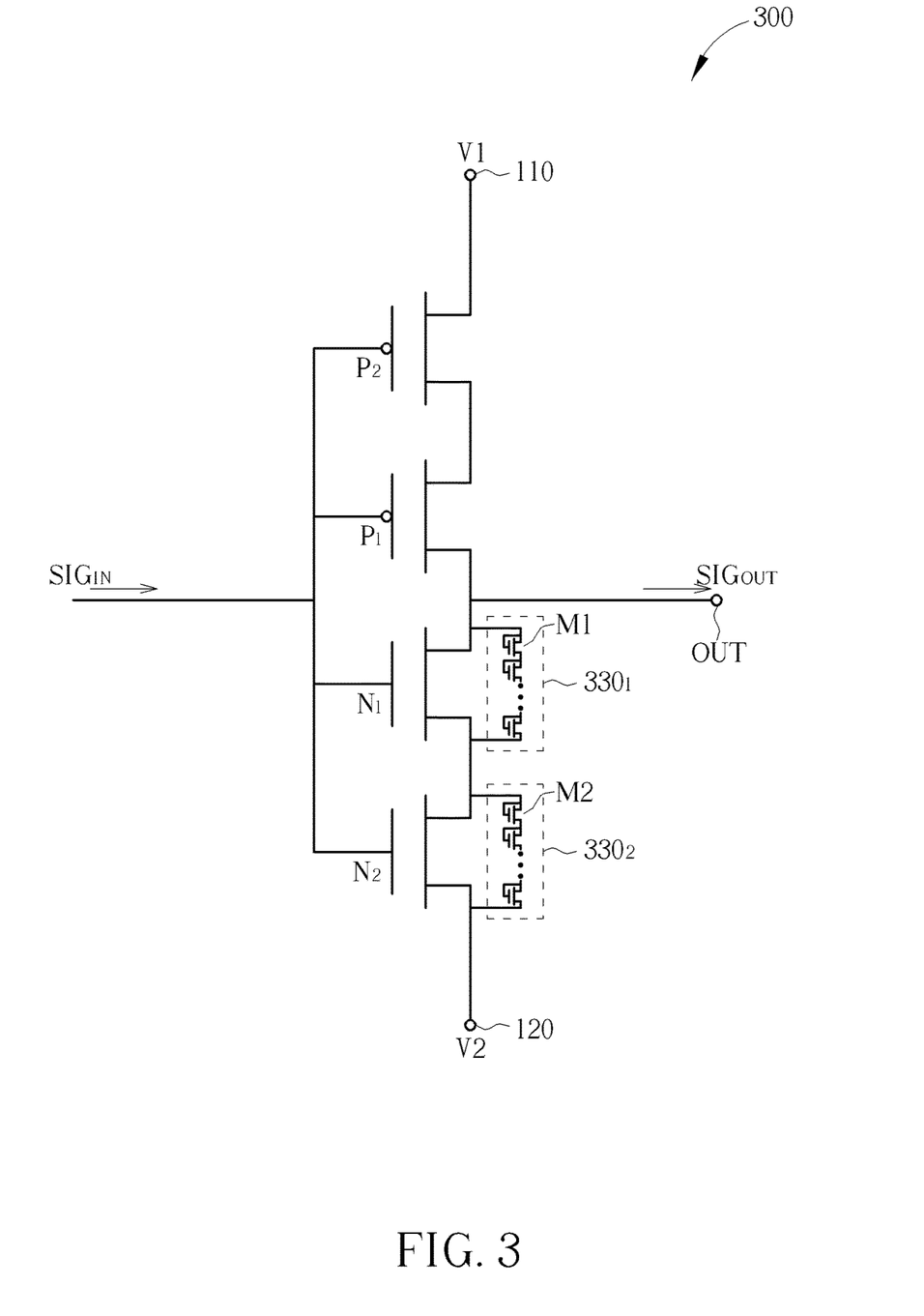
FIG. 3 shows an inverter according to another embodiment of the present invention.

In FIGS. 1 and 2, the inverters 100 and 200 use diodes to implement the voltage drop impedance elements $130_1$, $130_2$, $230_1$, and $230_2$. However, in other embodiments of the present invention, the inverter can also use diode-connected transistors coupled in series, resistors, or other types of elements to implement the voltage drop impedance elements. FIG. 3 shows an inverter 300 according to one embodiment of the preset invention. The inverters 100 and 300 have similar structures and can be operated with similar principles. However, the main difference between these two inverters is in that the voltage drop impedance element $330_1$ includes X diode-connected transistors M1 coupled in series, and the voltage drop impedance element $330_2$ includes Y diode-connected transistors M2 coupled in series.

For example, in FIG. 3, the transistors M1 and M2 can be N-type transistors. Also, for each of the transistors M1, the gate can be coupled to its drain, so that the transistor M1 would behave like a diode. Similarly, for each of the transistors M2, the gate can be coupled to its drain, so that the transistor M2 would behave like a diode. Also, the present invention does not limit the transistors M1 and M2 to N-type transistors. In some other embodiments, the transistors M1 and M2 can be P-type transistors, and the gates of the transistors M1 and M2 would be coupled to their drain accordingly, so the transistors M1 and M2 can be operated as diodes.

In addition, according to different system requirements, the voltage drop impedance elements coupled in parallel with different N-type transistors may have different resistant values or the same resistant value. For example, in FIG. 3, the voltage drop impedance element $330_1$ can include X diode-connected transistors M1 coupled in series while the voltage drop impedance element $330_2$ can include Y diode-connected transistors M2 coupled in series. In the case that the N-type transistors $N_1$ and $N_2$ have the same electronic characteristics, X and Y can be corresponding to the same integer greater than 1. Consequently, the effective impedance of the voltage drop impedance element $330_1$ in parallel with the N-type transistor $N_1$ being turned off would be equal to the effective impedance of the voltage drop impedance element $330_2$ in parallel with the N-type transistor $N_2$ being turned off, ensuring the cross voltages applied on the N-type transistors $N_1$ and $N_2$ to be the same. In some other situations, if the electronic characteristics of the N-type transistor $N_1$ and $N_2$ are different, then X and Y may be chosen to be different values so the cross voltages of the N-type transistor $N_1$ and $N_2$ can still be substantially the same.

However, in the case that the N-type transistors $N_1$ and $N_2$ have different electronic characteristics, if the difference between their electronic characteristics is not significant, then the impedances of the voltage drop impedance elements $330_1$ and $330_2$ would still be much smaller than the impedances of the N-type transistors $N_1$ and $N_2$ when the N-type transistors $N_1$ and $N_2$ are turned off. Therefore, the voltage drop impedance elements $330_1$ and $330_2$ will still dominate the cross voltages applied on the N-type transistors $N_1$ and $N_2$. In this case, even if the voltage drop impedance elements $330_1$ and $330_2$ have the same number of transistors, that is, even if X equals to Y, the cross voltages applied on the N-type transistors $N_1$ and $N_2$ can still be substantially balanced, mitigating the system instability caused by high cross voltages applied on only some of the transistors. Consequently, the design flow and the manufacturing process of the inverter 300 can be further simplified.

Figure 4:
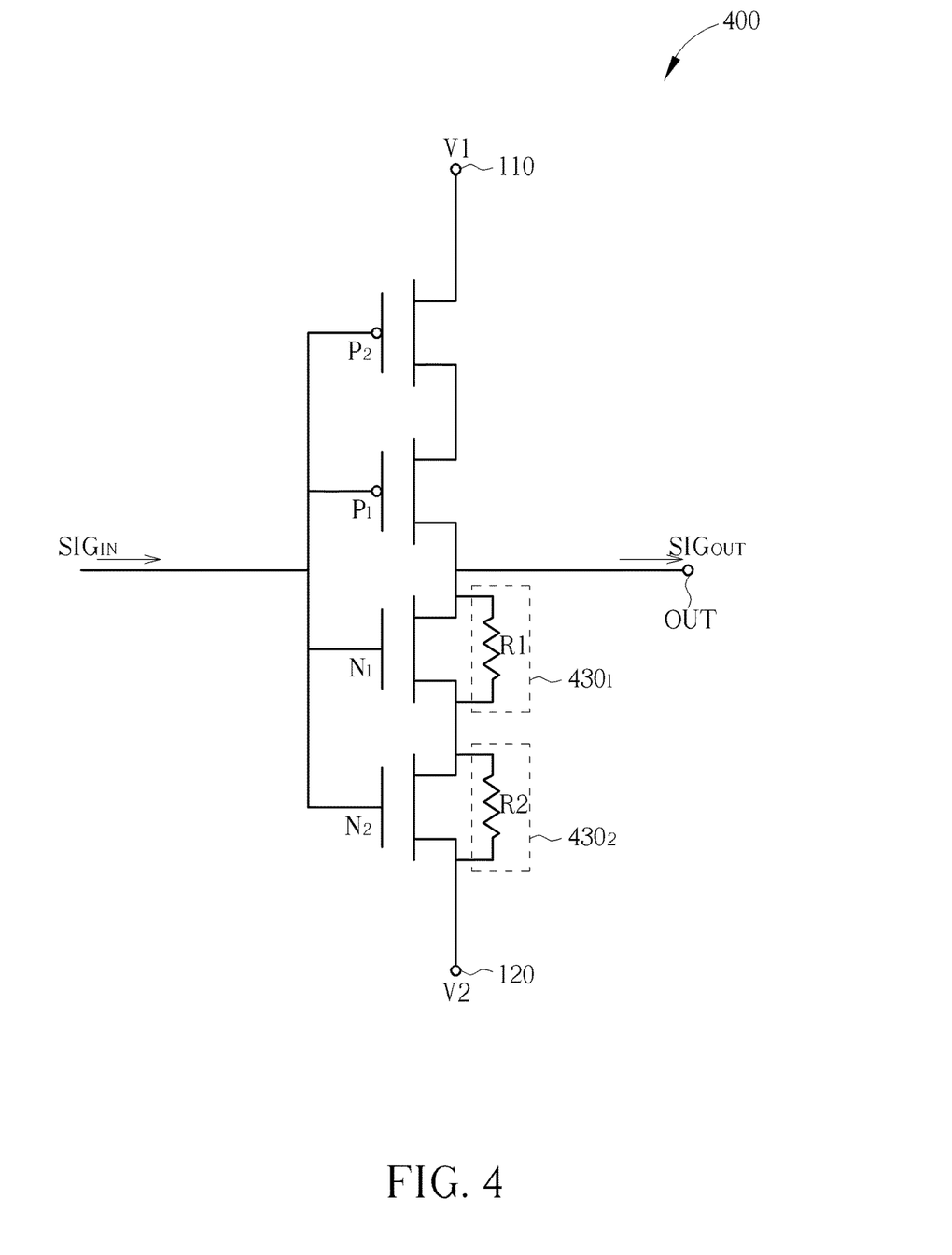
FIG. 4 shows an inverter according to another embodiment of the present invention.

FIG. 4 shows an inverter 400 according to one embodiment of the present invention. The inverters 100 and 400 have similar structures and can be operated with similar principles. However, the main difference between these two inverters is in that the voltage drop impedance element $430_1$ includes a resistor R1 and the voltage drop impedance element $430_2$ includes a resistor R2. By properly selecting the resistance of the resistors R1 and R2, the cross voltages applied on the N-type transistors $N_1$ and $N_2$ can be adjusted to be balanced, mitigating the system instability caused by high cross voltages applied on only some of the transistors.

Furthermore, in some embodiments, the inverters 100 to 400 can keep the balance between the cross voltages applied on the N-type transistors $N_1$ and $N_2$ even without the voltage drop impedance elements $130_2$, $230_2$, $330_2$, and $430_2$ but only with the voltage drop impedance elements $130_1$, $230_1$, $330_1$, and $430_1$, or without the voltage drop impedance elements $130_1$, $230_1$, $330_1$, and $430_1$ but only with the voltage drop impedance elements $130_2$, $230_2$, $330_2$, and $430_2$.

Generally, the structures of the N-type transistors are more fragile than the structures of the P-type transistors, and are easier to break down. Therefore, in FIGS. 1 to 4, the inverters 100 to 400 include the voltage drop impedance elements $130_1$ to $430_1$ coupled in parallel with the N-type transistor $N_1$ and the voltage drop impedance elements $130_2$ to $430_2$ coupled in parallel with the N-type transistor $N_2$, but the inverters 100 to 400 do not include the voltage drop impedance elements coupled in parallel with the P-type transistors $P_1$ and $P_2$. However, in other embodiments, the inverter may also include the voltage drop impedance elements coupled in parallel with the P-type transistors $P_1$ and $P_2$.

Figure 5:
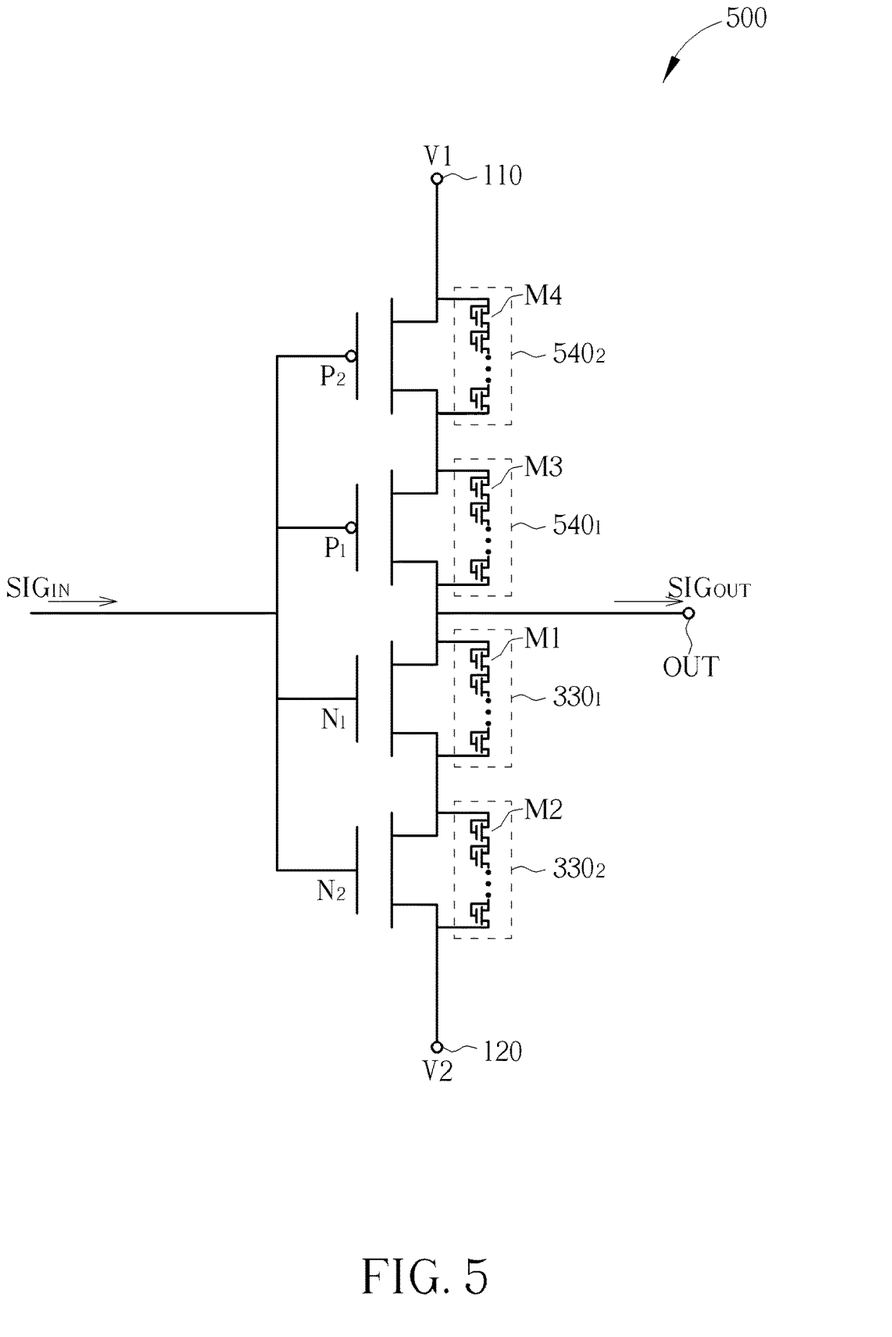
FIG. 5 shows an inverter according to another embodiment of the present invention.

FIG. 5 shows an inverter 500 according to one embodiment of the present invention. The inverters 500 and 300 have similar structures and can be operated with similar principles. However, the main difference between these two inverters is in that the inverter 500 further includes the voltage drop impedance elements $540_1$ and $540_2$. The voltage drop impedance element $540_1$ is coupled in parallel with the P-type transistor $P_1$, and the impedance of the voltage drop impedance element $540_1$ is smaller than the impedance of the P-type transistor $P_1$ when the P-type transistor $P_1$ is turned off. Also, the voltage drop impedance element $540_2$ is coupled in parallel with the P-type transistor $P_2$, and the impedance of the voltage drop impedance element $540_2$ is smaller than the impedance of the P-type transistor $P_2$ when the P-type transistor $P_2$ is turned off.

In other words, when the P-type transistors $P_1$ and $P_2$ are turned off, the P-type transistors $P_1$ and $P_2$ will have to endure the voltage between the first system voltage terminal 110 and the output terminal OUT. However, in this case, the voltage drop impedance elements $540_1$ and $540_2$ can form a current path between the first system voltage terminal 110 and the output terminal OUT. Also, since the impedances of the voltage drop impedance elements $540_1$ and $540_2$ are smaller than the impedances of the P-type transistors $P_1$ and $P_2$ when the P-type transistors $P_1$ and $P_2$ are turned off, the current flowing through the voltage drop impedance elements $540_1$ and $540_2$ would be greater than the leakage current flowing through the P-type transistors $P_1$ and $P_2$ when the P-type transistors $P_1$ and $P_2$ are turned off. In this case, by properly selecting the voltage drop impedance elements $540_1$ and $540_2$, the cross voltages applied on the P-type transistors $P_1$ and $P_2$ can be balanced.

For example, if the effective impedance of the voltage drop impedance element $540_1$ in parallel with the P-type transistor $P_1$ being turned off is substantially equal to the effective impedance of the voltage drop impedance element $540_2$ in parallel with the P-type transistor $P_2$ being turned off, then the voltage between the first system voltage terminal 110 and the output terminal OUT will be endured by the voltage drop impedance element $540_1$ coupled in parallel with the P-type transistor $P_1$ and the voltage drop impedance element $540_2$ coupled in parallel with the P-type transistor $P_2$ equally. In other words, the P-type transistor $P_1$ and $P_2$ would have the same cross voltages. Consequently, the issue of system instability caused by unbalanced cross voltages on the P-type transistors $P_1$ and $P_2$ can be mitigated. In some embodiments, since the inverter 500 is operated with direct current (DC) power, the effective impedance can be referred to as effective resistance.

In FIG. 5, the voltage drop impedance element $540_1$ can be implemented by a plurality of diode-connected transistors M3 coupled in series, and the voltage drop impedance element $540_2$ can be implemented by a plurality of diode-connected transistors M4 coupled in series. Also, in the embodiment shown in FIG. 5, the transistors M3 and M4 can be N-type transistors. However, in some embodiments, the transistors M3 and M4 can also be P-type transistors.

Furthermore, in other embodiments, the voltage drop impedance elements $540_1$ and $540_2$ can be implemented by a plurality of diodes coupled in series or a resistor, such as the voltage drop impedance elements $130_1$ and $130_2$ shown in FIG. 1, the voltage drop impedance elements $230_1$ and $230_2$ shown in FIG. 2, or the voltage drop impedance elements $430_1$ and $430_2$ shown in FIG. 4.

Figure 6:
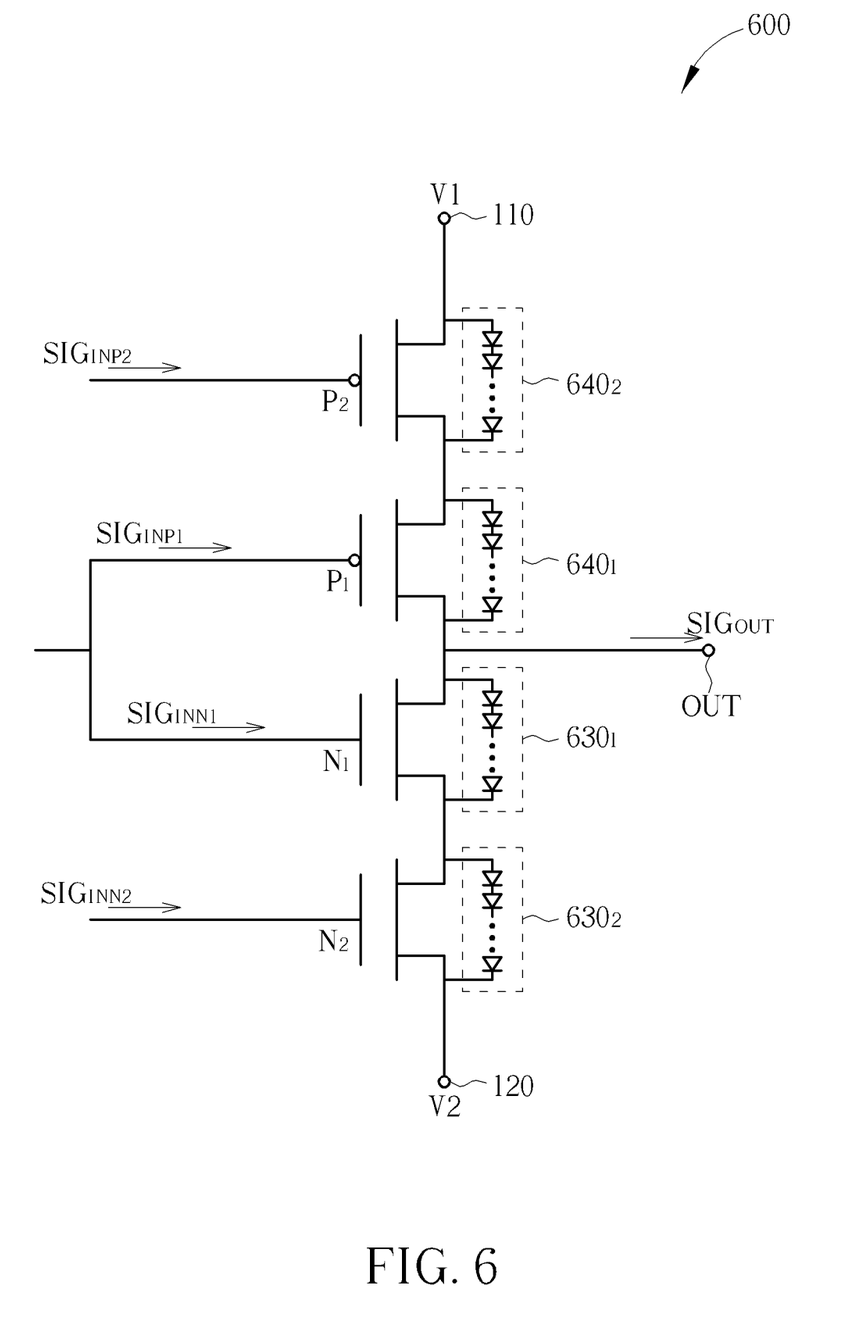
FIG. 6 shows an inverter according to another embodiment of the present invention.

FIG. 6 shows an inverter 600 according to one embodiment of the present invention. In the embodiments shown in FIGS. 1 to 5, the control terminals of the N-type transistors $N_1$ and $N_2$ and the control terminals of the P-type transistors $P_1$ and $P_2$ can all receive the same control signal $SIG_{IN}$; therefore, the P-type transistors $P_1$ and $P_2$ are operated synchronously, and the N-type transistors $N_1$ and $N_2$ are operated synchronously. Also, when the P-type transistors $P_1$ and $P_2$ are turned on, the N-type transistors $N_1$ and $N_2$ are turned off, and when the P-type transistors $P_1$ and $P_2$ are turned off, the N-type transistors $N_1$ and $N_2$ are turned on. However, this is not to limit the present invention. In FIG. 6, the N-type transistors $N_1$ and $N_2$ of the inverter 600 can receive different control signals $SIG_{INN1}$ and $SIG_{INN2}$, and the P-type transistors $P_1$ and $P_2$ of the inverter 600 can receive different control signals $SIG_{INP1}$ and $SIG_{INP2}$. In this case, the P-type transistors $P_1$ and $P_2$ can still be operated synchronously, and the N-type transistors $N_1$ and $N_2$ can still be operated synchronously. Also, when the P-type transistors $P_1$ and $P_2$ are turned on, the N-type transistors $N_1$ and $N_2$ are turned off, and when the P-type transistors $P_1$ and $P_2$ are turned off, the N-type transistors $N_1$ and $N_2$ are turned on.

In some embodiments, to output the high voltage through the output terminal OUT, the N-type transistors $N_1$ and $N_2$ have to be turned off. For example, if the first voltage V1 is 6V, and the second voltage V2 is 0V, then the control signals $SIG_{INP1}$ and $SIG_{INP2}$ should turn on the P-type transistors $P_1$ and $P_2$, and the control signals $SIG_{INN1}$ and $SIG_{INN2}$ should turn off the N-type transistors $N_1$ and $N_2$ so that the inverter 600 can output the high voltage close to the first voltage V1. In this case, if the control signals $SIG_{INN1}$ and $SIG_{INN2}$ are both at the low voltage, such as 0V, for turning off the N-type transistors $N_1$ and $N_2$, then the gate-to-drain voltage of the N-type transistor $N_1$ would be close to the voltage difference between the first voltage V1 and the second voltage V2, such as 6V. If the voltage difference between the first voltage V1 and the second voltage V2 is rather large, the N-type transistor $N_1$ may generate significant leakage current or even break down. Therefore, in this case, the control signal $SIG_{INN1}$ can be set to 3V, which is half of the voltage difference between the first voltage V1 and the second voltage V2, the control signal $SIG_{INN2}$ can be set to 0V, and the control signals $SIG_{INP1}$ and $SIG_{INP2}$ can both be set to 3V. That is, when the control signals $SIG_{INN1}$ and $SIG_{INN2}$ received by the control terminals of the N-type transistors $N_1$ and $N_2$ are at different voltages, the control signals $SIG_{INP1}$ and $SIG_{INP2}$ received by the control terminals of the P-type transistors $P_1$ and $P_2$ are at the same voltage. Consequently, while the N-type transistors $N_1$ and $N_2$ can be turned off effectively, the possibility of the N-type transistors $N_1$ and $N_2$ being damaged by large gate-to-source voltages and gate-to-drain voltages can be reduced. In the embodiments aforementioned, if the inverter includes K N-type transistors $N_1$ to $N_K$, then the K N-type transistors $N_1$ to $N_K$ can receive the different control signals $SIG_{INN1}$ to $SIG_{INNK}$, where the voltage of the Nth control signal $SIG_{INNN}$ can be set to $SIG_{INNN}=V2+(K-N)\cdot X$, where $$X = \frac{V1}{K}.$$

Similarly, to output the low voltage through the output terminal OUT, the P-type transistors $P_1$ and $P_2$ have to be turned off. When turning off the P-type transistors $P_1$ and $P_2$, the similar principle mentioned in the previous case may be applied, that is, the control signals $SIG_{INN1}$ and $SIG_{INN2}$ can both be at 3V while the control signals $SIG_{INP1}$ and $SIG_{INP2}$ can be at 3V and 6V respectively. In other words, when the control signals $SIG_{INP1}$ and $SIG_{INP2}$ received by the control terminals of the P-type transistors $P_1$ and $P_2$ are at different voltages, the control signals $SIG_{INN1}$ and $SIG_{INN2}$ received by the control terminals of the N-type transistors $N_1$ and $N_2$ are at the same voltage so the possibility of the P-type transistors $P_1$ and $P_2$ being damaged by large gate-to-source voltages and gate-to-drain voltages can be reduced. In this case, the N-type transistor $N_1$ and the P-type transistor $P_1$ can substantially controlled by the same control signal, that is, the control signals $SIG_{INN1}$ and $SIG_{INP1}$ can be substantially the same control signal. In the embodiments aforementioned, if the inverter includes K P-type transistors $P_1$ to $P_K$, then the K P-type transistors $P_1$ to $P_K$ can receive the different control signals $SIG_{INP1}$ to $SIG_{INPK}$, where the voltage of the Nth control signal $SIG_{INPN}$ can be set to $SIG_{INPN}=V1-(K-N)\cdot X$, where $$X = \frac{V1}{K}.$$

Furthermore, although the inverters 100 to 600 all include two N-type transistors $N_1$ and $N_2$ and two P-type transistors $P_1$ and $P_2$, however, in other embodiments, the inverter may include more transistors according to the system requirement.

Figure 7:
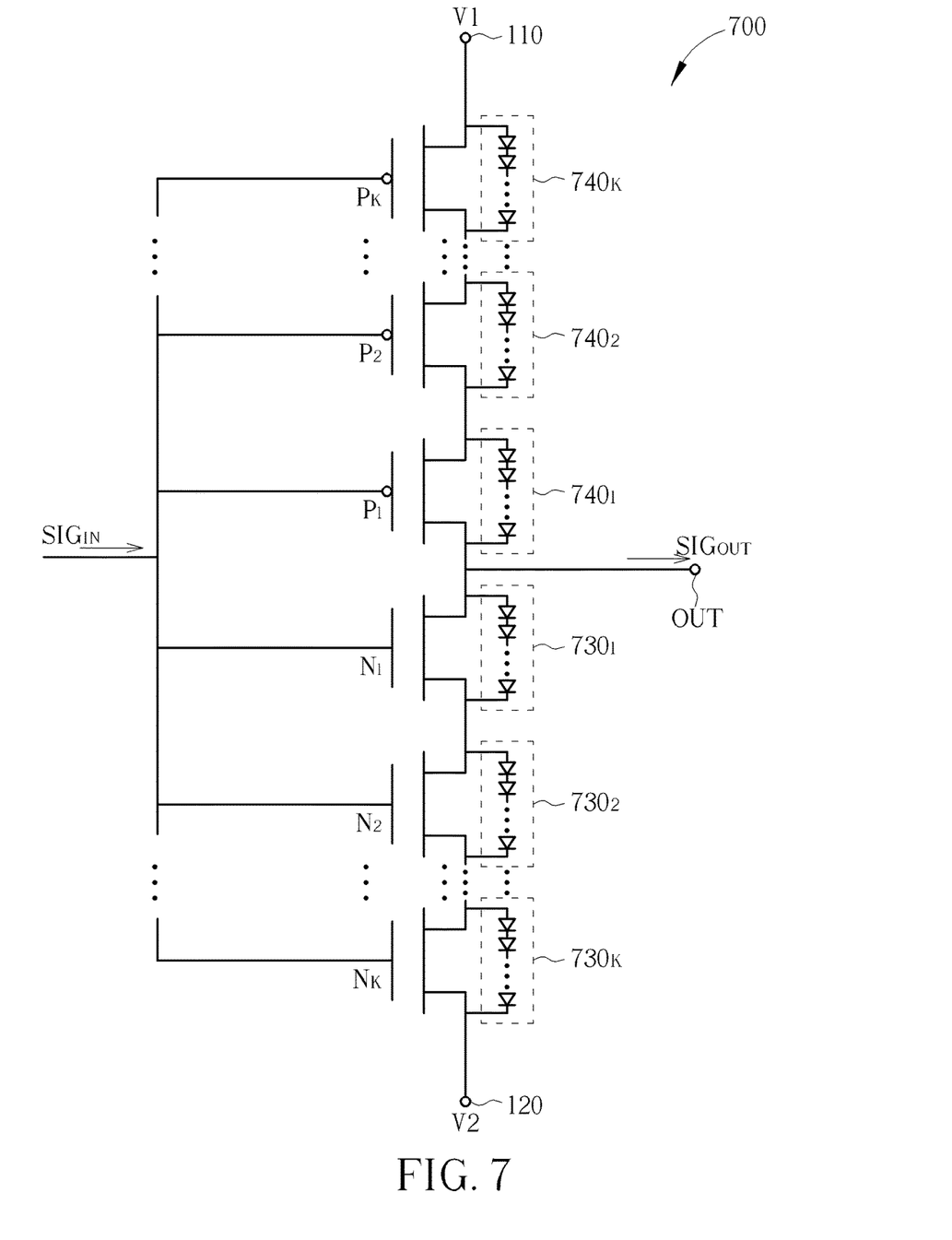
FIG. 7 shows an inverter according to another embodiment of the present invention.

FIG. 7 shows an inverter 700 according to one embodiment of the present invention. The inverter 700 includes K N-type transistors $N_1$ to $N_K$, K P-type transistors $P_1$ to $P_K$, K voltage drop impedance elements $730_1$ to $730_K$ coupled in parallel with the K N-type transistors $N_1$ to $N_K$ respectively, and K voltage drop impedance elements $740_1$ to $740_K$ coupled in parallel with the K P-type transistors $P_1$ to $P_K$ respectively, where K is an integer greater than 2. Since the inverter 700 includes more transistors than the inverters 100 to 600, the inverter 700 can be used to output higher voltages. Also, by selecting the voltage drop impedance elements $730_1$ to $730_K$ and $740_1$ to $740_K$ with proper impedance, the cross voltages applied on the N-type transistors $N_1$ to $N_K$ can be balanced when the inverter 700 outputs the high voltage, and the cross voltages applied on the P-type transistors $P_1$ to $P_K$ can be balanced when the inverter 700 outputs the low voltage. Therefore, the system instability caused by unbalanced cross voltages on the transistors can be mitigated.

In addition, in FIG. 7, the K N-type transistors $N_1$ to $N_K$ and the K P-type transistors $P_1$ to $P_K$ can all receive the same control signal $SIG_{IN}$, however, in other embodiments, the K N-type transistors $N_1$ to $N_K$ and the K P-type transistors $P_1$ to $P_K$ may also receive different control signals while the N-type transistors $N_1$ to $N_K$ can be operated synchronously, and the P-type transistors $P_1$ to $P_K$ can be operated synchronously. Also, when the P-type transistors $P_1$ to $P_K$ are turned on, the N-type transistors $N_1$ to $N_K$ are turned off, and when the plurality of P-type transistors $P_1$ to $P_K$ are turned off, the N-type transistors $N_1$ to $N_K$ are turned on. Therefore, the possibility of the transistors being damaged by large gate-to-source voltages and gate-to-drain voltages can be reduced.

Figure 8:
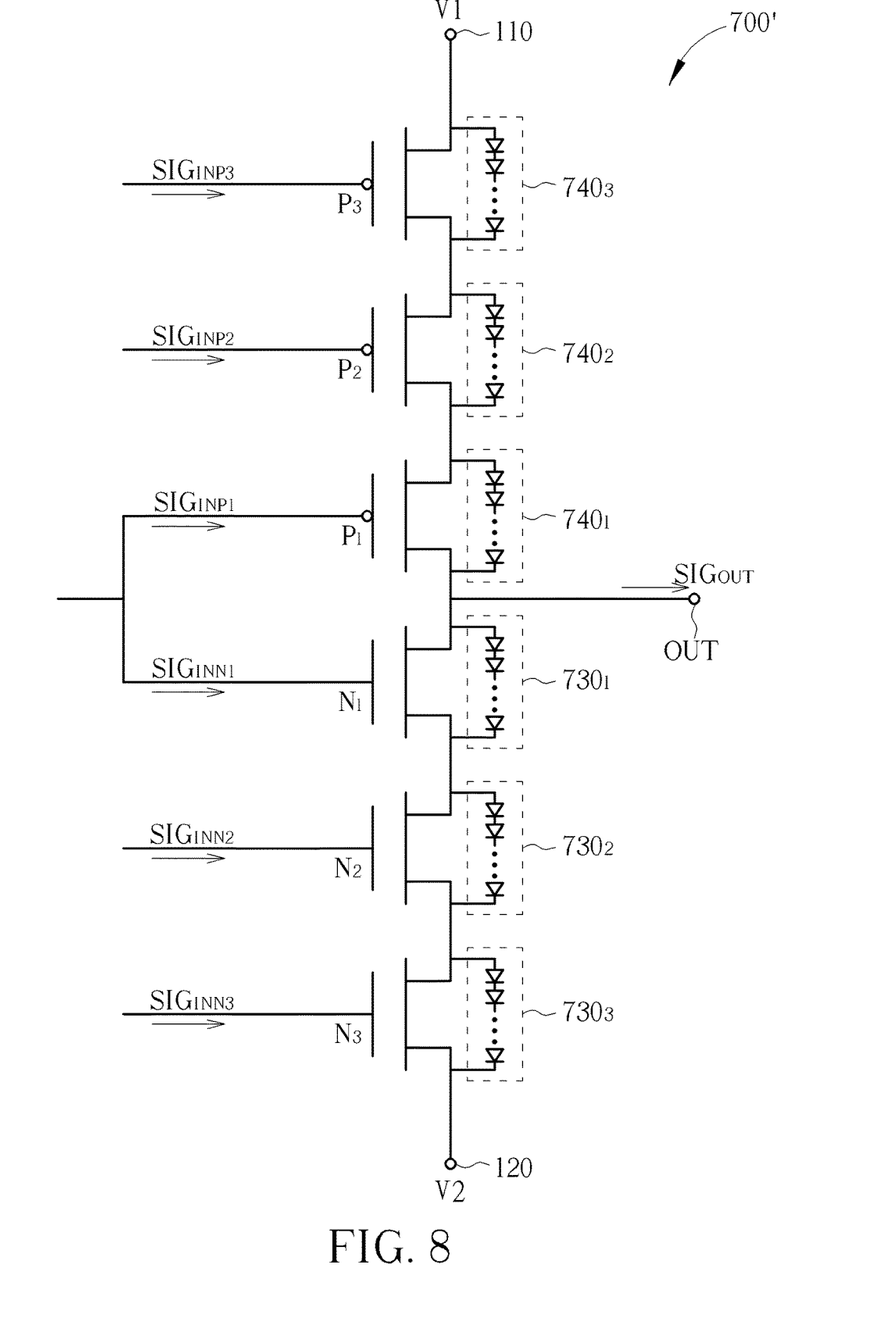
FIG. 8 shows an inverter according to another embodiment of the present invention.

FIG. 8 shows an inverter 700' according to one embodiment of the present invention. The inverters 700' and 700 have similar structures, and in FIG. 8, K is 3. That is, the inverter 700' includes 3 N-type transistors $N_1$ to $N_3$ and 3 P-type transistors $P_1$ to $P_3$. In addition, the N-type transistors $N_1$ to $N_3$ may receive the control signals $SIG_{INN1}$ to $SIG_{INN3}$ respectively, and the P-type transistors $P_1$ to $P_3$ may receive the control signals $SIG_{INP1}$ to $SIG_{INP3}$ respectively.

In some embodiments, the inverter may include K P-type transistors and K N-type transistors, and the user may decide the number K according to the first voltage V1 and the second voltage V2, and then decide the voltages of the control signals according to the number K so the control signals $SIG_{INN1}$ to $SIG_{INNK}$ can be, for example, arranged to be close to the equal-distribution. For example, in the case with the first voltage V1 being 9V and the second voltage V2 being 0V, the user may decide K to be 3 first as shown in FIG. 8. In this case, to turn off N-type transistors $N_1$, $N_2$, and $N_3$ for outputting the high voltage through the output terminal OUT, the control signals $SIG_{INP1}$, $SIG_{INP2}$, and $SIG_{INP3}$ can all be set to 6V while the control signal $SIG_{INN1}$ can be set to 6V, the control signal $SIG_{INN2}$ can be set to 3V, and the control signal $SIG_{INN3}$ can be set to 0V. In other words, when the control signals $SIG_{INN1}$, $SIG_{INN2}$, and $SIG_{INN3}$ received by the control terminals of the N-type transistors $N_1$, $N_2$, and $N_3$ are at different voltages, the control signals $SIG_{INP1}$, $SIG_{INP2}$, and $SIG_{INP3}$ received by the control terminals of the P-type transistors $P_1$, $P_2$, and $P_3$ are at the same voltage. Consequently, while turning off the N-type transistors $N_1$, $N_2$, and $N_3$ effectively, the possibility of the N-type transistors $N_1$, $N_2$, and $N_3$ being damaged by large gate-to-source voltages and gate-to-drain voltages can be reduced. In the aforementioned embodiments, if the inverter includes K N-type transistors $N_1$ to $N_K$, then the K N-type transistors $N_1$ to $N_K$ can receive different control signals $SIG_{INN1}$ to $SIG_{INNK}$, where the voltage of the Nth control signal $SIG_{INNN}$ can be set to $SIG_{INNN}=V2+(K-N)\cdot X$, where $$X = \frac{V1}{K}.$$

Similarly, to output the low voltage through the output terminal OUT, the P-type transistors $P_1$, $P_2$, and $P_3$ have to be turned off. In the case with the first voltage V1 being 9V and the second voltage V2 being 0V, the control signals $SIG_{INN1}$, $SIG_{INN2}$, and $SIG_{INN3}$ can all be set to 3V while the control signal $SIG_{INP1}$ can be set to 3V, the control signal $SIG_{INP2}$ can be set to 6V, and the control signal $SIG_{INP3}$ can be set to 9V. In other words, when the control signals $SIG_{INP1}$, $SIG_{INP2}$, and $SIG_{INP3}$ received by the control terminals of the P-type transistors $P_1$, $P_2$, and $P_3$ are at different voltages, the control signals $SIG_{INN1}$, $SIG_{INN2}$, and $SIG_{INN3}$ received by the control terminals of the N-type transistors $N_1$, $N_2$, and $N_3$ are at the same voltage. Consequently, while turning off the P-type transistors $P_1$, $P_2$, and $P_3$ effectively, the possibility of the P-type transistors $P_1$, $P_2$, and $P_3$ being damaged by large gate-to-source voltages and gate-to-drain voltages can be reduced. Also, in the aforementioned embodiments, the inverter may include K P-type transistors and K N-type transistors, and the user may decide the number K according to the first voltage V1 and the second voltage V2, and then decide the voltages of the control signals according to the number K. If the inverter includes K P-type transistors $P_1$ to $P_K$, then the K P-type transistors $P_1$ to $P_K$ can receive different control signals $SIG_{INP1}$ to $SIG_{INPK}$, where the voltage of the Nth control signal $SIG_{INPN}$ can be set to $SIG_{INPN}=V1-(K-N)\cdot X$, where $$X = \frac{V1}{K}.$$

Consequently, the control signals $SIG_{INP1}$ to $SIG_{INPK}$ can be, for example, arranged to be close to the equal-distribution.

In other words, in FIG. 8, although the N-type transistors $N_1$, $N_2$, and $N_3$ can receive different control signals, the N-type transistors $N_1$, $N_2$, and $N_3$ can still be operated synchronously, that is, can be turned on and turned off simultaneously. Also, although the P-type transistors $P_1$, $P_2$, and $P_3$ can receive different control signals, the P-type transistors $P_1$, $P_2$, and $P_3$ can still be operated synchronously. In addition, the N-type transistors $N_1$, $N_2$, and $N_3$ are turned off when the P-type transistors $P_1$, $P_2$, and $P_3$ are turned on, and the P-type transistors $P_1$, $P_2$, and $P_3$ are turned off when the N-type transistors $N_1$, $N_2$, and $N_3$ are turned on. Therefore, the N-type transistors $N_1$, $N_2$, and $N_3$ and the P-type transistors $P_1$, $P_2$, and $P_3$ can be operated normally while the possibility of the transistors being damaged by large gate-to-source voltages and gate-to-drain voltages can be reduced.

Figure 9:
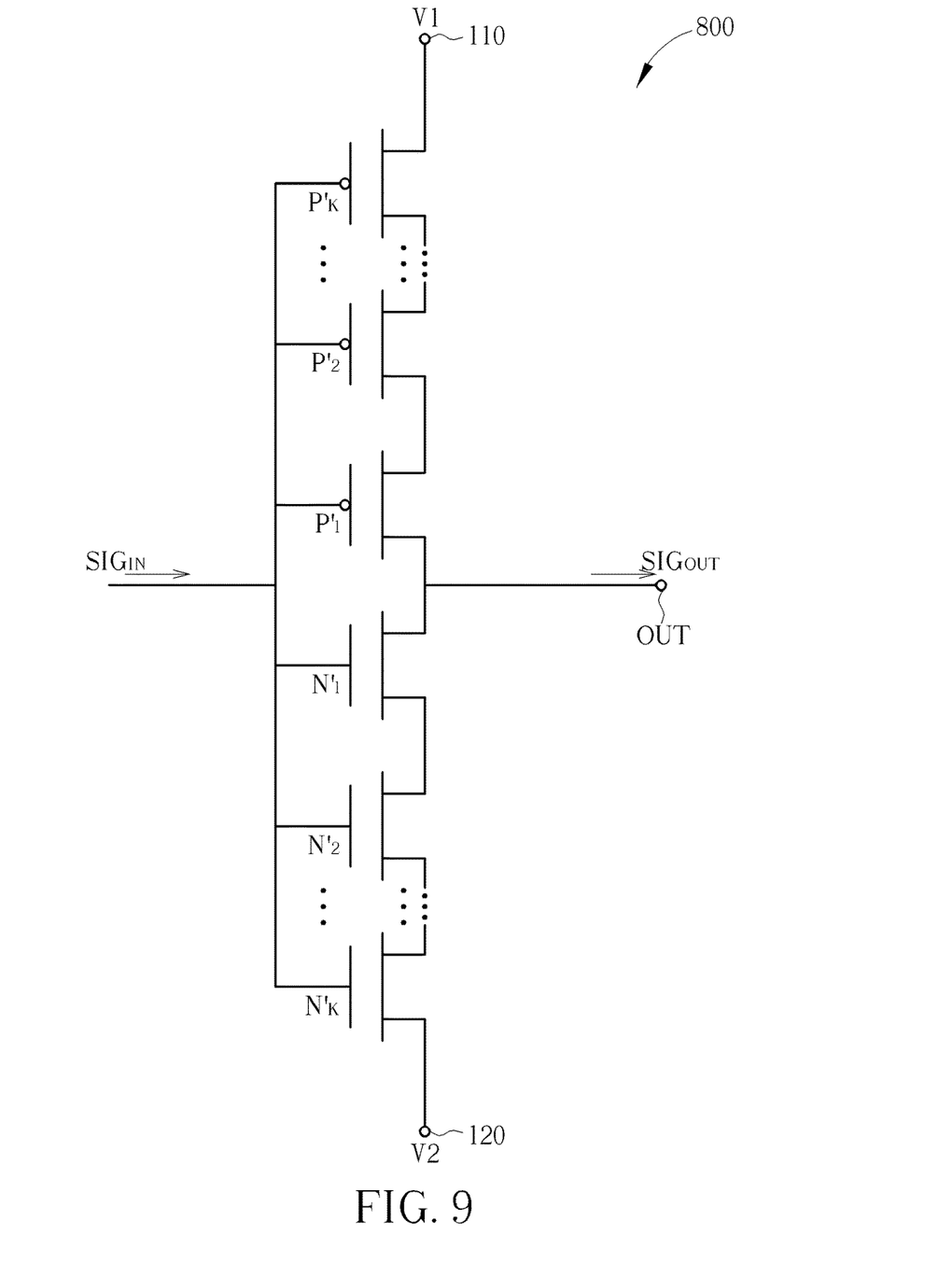
FIG. 9 shows an inverter according to another embodiment of the present invention.

FIG. 9 shows an inverter 800 according to one embodiment of the present invention. The inverter 800 includes a first system voltage terminal 110, a second system voltage terminal 120, an output terminal OUT, K P-type transistors $P'_1$ to $P'_K$, and K N-type transistors $N'_1$ to $N'_K$, where K is an integer greater than 1. To reduce the possibility of the P-type transistors $P'_1$ to $P'_K$ and N-type transistors $N'_1$ to $N'_K$ being damaged by large gate-to-source voltages and gate-to-drain voltages when turned off, the user can choose the number K according to the first voltage V1 and the second voltage V2 properly.

In FIG. 9, since the N-type transistor $N'_1$ is closer to the output terminal OUT while the N-type transistor $N'_2$ is closer to the second system voltage terminal 120, the gate-to-source voltages of these two transistors may be different. Therefore, when turned off, the impedances of the N-type transistors $N'_1$ and $N'_2$ may be quite different, causing the cross voltages applied on the N-type transistors $N'_1$ and $N'_2$ to be unbalanced. Since the N-type transistor $N'_1$ may have to endure a larger cross voltage, the N-type transistor $N'_1$ can be chosen to have a channel width-to-length ratio greater than the channel width-to-length ratio of the N-type transistor $N'_2$. Consequently, the impedance of the N-type transistor $N'_1$ would be smaller than the impedance of the N-type transistor $N'_2$, so the cross voltage applied on the N-type transistor $N'_1$ can be reduced. That is, by selecting the N-type transistors $N'_1$ and $N'_2$ to have proper channel width-to-length ratios, the cross voltages applied to the N-type transistors $N'_1$ and $N'_2$ can be balanced.

Similarly, the user can also choose the N-type transistor $N'_2$ to have a channel width-to-length ratio greater than the N-type transistor $N'_3$, and so on, and finally choose the N-type transistor $N'_{(K-1)}$ to have a channel width-to-length ratio greater than the N-type transistor $N'_K$. Consequently, when the N-type transistors $N'_1$ to $N'_K$ are turned off, the cross voltages applied on the N-type transistors $N'_1$ to $N'_K$ would have similar values, mitigating the system instability caused by unbalanced cross voltages applied on the N-type transistors $N'_1$ to $N'_K$.

Similarly, the inverter 800 can also select the P-type transistors $P'_1$ to $P'_K$ to have proper channel width-to-length ratios, so that the channel width-to-length ratio of the P-type transistor $P'_1$ would be greater than the P-type transistor $P'_2$, the channel width-to-length ratio of the P-type transistor $P'_2$ would be greater than the P-type transistor $P'_3$, and so on, and finally, the channel width-to-length ratio of the P-type transistor $P'_{(K-1)}$ would be greater than the P-type transistor $P'_K$. Consequently, when the P-type transistors $P'_1$ to $P'_K$ are turned off, the cross voltages applied on the P-type transistors $P'_1$ to $P'_K$ would have similar values, mitigating the system instability caused by unbalanced cross voltages applied on the P-type transistors $P'_1$ to $P'_K$.

In FIG. 9, the control terminals of the P-type transistors $P'_1$ to $P'_K$ and the control terminals of the N-type transistors $N'_1$ to $N'_K$ can be coupled together for receiving the same control signal $SIG_{IN}$, so the P-type transistors $P'_1$ to $P'_K$ can be operated synchronously and the N-type transistors $N'_1$ to $N'_K$ can be operated synchronously. Also, the N-type transistors $N'_1$ to $N'_K$ are turned off when the P-type transistors $P'_1$ to $P'_K$ are turned on, and the P-type transistors $P'_1$ to $P'_K$ are turned off when the N-type transistors $N'_1$ to $N'_K$ are turned on. However, in other embodiments, the control terminals of the P-type transistors $P'_1$ to $P'_K$ may receive different control signals and the control terminals of the N-type transistors $N'_1$ to $N'_K$ may receive different control signals as shown in FIG. 8. Even in this case, the P-type transistors $P'_1$ to $P'_K$ can still be operated synchronously and the N-type transistors $N'_1$ to $N'_K$ can still be operated synchronously. Also, the N-type transistors $N'_1$ to $N'_K$ are turned off when the P-type transistors $P'_1$ to $P'_K$ are turned on, and the P-type transistors $P'_1$ to $P'_K$ are turned off when the N-type transistors $N'_1$ to $N'_K$ are turned on. Therefore, the possibility of the N-type transistors $N'_1$ to $N'_K$ and the P-type transistors $P'_1$ to $P'_K$ being damaged by the large gate-to-source voltages and gate-to-drain voltages when turned off can be reduced. In addition, in some embodiments, the inverter 800 can also further combine with the voltage drop impedance elements.

In the aforementioned embodiments, the N-type transistors $N_1$ to $N_K$ and $N'_1$ to $N'_K$, the P-type transistors $P_1$ to $P_K$ and $P'_1$ to $P'_K$, and the voltage drop impedance elements $130_1$, $130_2$, $230_1$, $230_2$, $330_1$, $330_2$, $430_1$, $430_2$, $540_1$, $540_2$, $630_1$, $630_2$, $640_1$, $640_2$, $730_1$ to $730_K$, and $740_1$ to $740_K$ can all be manufactured by a Complementary Metal-Oxide-Semiconductor (CMOS) manufacturing process. That is, the whole inverter 100 to 800 can be manufactured with the same process. Also, to further reduce the leakage currents, the silicon on insulator (SOI) manufacturing process may be adopted. In addition, the inverter manufactured by the silicon on insulator manufacturing process may have better high-frequency performance.

In summary, the inverters provided by the embodiments of the present invention can adjust and balance the cross voltages applied on the transistors with voltage drop impedance elements or the channel width-to-length ratios of the transistors. Therefore, the system instability caused by unbalanced cross voltages on the transistors can be mitigated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An inverter comprising:
   a first system voltage terminal configured to receive a first voltage;
   a second system voltage terminal configured to receive a second voltage;
   an output terminal;
   a plurality of P-type transistors coupled in series between the first system voltage terminal and the output terminal;
   a plurality of N-type transistors coupled in series between the output terminal and the second system voltage terminal; and
   a first voltage drop impedance element coupled in parallel with a first N-type transistor of the plurality of N-type transistors;

wherein:
an impedance of the first voltage drop impedance element is smaller than an impedance of the first N-type transistor when the first N-type transistor is turned off;
the first voltage drop impedance element comprises X diodes coupled in series or X diode-connected transistors coupled in series;
X is an integer greater than 1; and
a cathode of a first diode of the X diodes is coupled to an anode of a second diode of the X diodes.

2. The inverter of claim 1, wherein a voltage at an anode of each diode is lower or higher than a voltage at its cathode.

3. The inverter of claim 1, wherein:
the first N-type transistor has a first terminal coupled to the output terminal, a second terminal coupled to a second N-type transistor of the plurality of N-type transistors, and a control terminal;
wherein the inverter further comprises:
a second voltage drop impedance element coupled in parallel with the second N-type transistor, and an impedance of the second voltage drop impedance element is smaller than an impedance of the second N-type transistor when the second N-type transistor is turned off.

4. The inverter of claim 3, wherein an effective impedance of the first voltage drop impedance element in parallel with the first N-type transistor being turned off is substantially equal to an effective impedance of the second voltage drop impedance element in parallel with the second N-type transistor being turned off.

5. The inverter of claim 3, wherein the impedance of the first voltage drop impedance element is substantially equal to the impedance of the second voltage drop impedance element.

6. The inverter of claim 3, wherein:
the second voltage drop impedance element comprises Y diodes coupled in series or Y diode-connected transistors coupled in series; and
Y is an integer greater than 1.

7. The inverter of claim 6, wherein X is equal to or unequal to Y.

8. The inverter of claim 6, further comprising:
a third voltage drop impedance element coupled in parallel with a first P-type transistor of the plurality of P-type transistors.

9. The inverter of claim 8, further comprising:
a fourth voltage drop impedance element coupled in parallel with a second P-type transistor of the plurality of P-type transistors.

10. The inverter of claim 9, wherein:
the third voltage drop impedance element comprises a resistor, a plurality of diodes coupled in series, or a plurality of diode-connected transistors coupled in series; and
the fourth voltage drop impedance element comprises a resistor, a plurality of diodes coupled in series, or a plurality of diode-connected transistors coupled in series.

11. The inverter of claim 1, wherein:
when a plurality of control signals received by a plurality of control terminals of the plurality of P-type transistors are at different voltages, a plurality of control signals received by a plurality of control terminals of the plurality of N-type transistors are at a same voltage;
the plurality of P-type transistors are operated synchronously;
the plurality of N-type transistors are operated synchronously;
when the plurality of P-type transistors are turned on, the plurality of N-type transistors are turned off; and
when the plurality of P-type transistors are turned off, the plurality of N-type transistors are turned on.

12. The inverter of claim 1, wherein:
when a plurality of control signals received by a plurality of control terminals of the plurality of N-type transistors are at different voltages, a plurality of control signals received by a plurality of control terminals of the plurality of P-type transistors are at a same voltage;
the plurality of P-type transistors are operated synchronously;
the plurality of N-type transistors are operated synchronously;
when the plurality of P-type transistors are turned on, the plurality of N-type transistors are turned off; and
when the plurality of P-type transistors are turned off, the plurality of N-type transistors are turned on.

13. An inverter comprising:
a first system voltage terminal configured to receive a first voltage;
a second system voltage terminal configured to receive a second voltage;
an output terminal;
a plurality of P-type transistors coupled in series between the first system voltage terminal and the output terminal;
a plurality of N-type transistors coupled in series between the output terminal and the second system voltage terminal;
a first voltage drop impedance element coupled in parallel with a first N-type transistor of the plurality of N-type transistors; and
a second voltage drop impedance element coupled in parallel with a second N-type transistor of the plurality of N-type transistors;
wherein:
the first N-type transistor has a first terminal coupled to the output terminal, a second terminal coupled to the second N-type transistor of the plurality of N-type transistors, and a control terminal;
an impedance of the first voltage drop impedance element is smaller than an impedance of the first N-type transistor when the first N-type transistor is turned off;
an impedance of the second voltage drop impedance element is smaller than an impedance of the second N-type transistor when the second N-type transistor is turned off;
the first voltage drop impedance element comprises X diodes coupled in series or X diode-connected transistors coupled in series;
the second voltage drop impedance element comprises Y diodes coupled in series or Y diode-connected transistors coupled in series; and
X and Y are integers greater than 1.

14. The inverter of claim 13, further comprising:
a third voltage drop impedance element coupled in parallel with a first P-type transistor of the plurality of P-type transistors.

15. The inverter of claim 14, further comprising:
a fourth voltage drop impedance element coupled in parallel with a second P-type transistor of the plurality of P-type transistors.

16. The inverter of claim 15, wherein:
the third voltage drop impedance element comprises a resistor, a plurality of diodes coupled in series, or a plurality of diode-connected transistors coupled in series; and
the fourth voltage drop impedance element comprises a resistor, a plurality of diodes coupled in series, or a plurality of diode-connected transistors coupled in series.

\* \* \* \* \*